United States Patent
Van Dam et al.

(10) Patent No.: US 11,549,806 B2
(45) Date of Patent: *Jan. 10, 2023

(54) METROLOGY APPARATUS

(71) Applicant: ASML Netherlands B.V., Veldhoven (NL)

(72) Inventors: Marinus Johannes Maria Van Dam, Venlo (NL); Arie Jeffrey Den Boef, Waalre (NL); Nitesh Pandey, Eindhoven (NL)

(73) Assignee: ASML Netherland B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/141,698

(22) Filed: Jan. 5, 2021

(65) Prior Publication Data

US 2021/0123724 A1 Apr. 29, 2021

Related U.S. Application Data

(63) Continuation of application No. 16/558,457, filed on Sep. 3, 2019, now Pat. No. 10,895,452.

(30) Foreign Application Priority Data

Sep. 4, 2018 (EP) .................................... 18192442
Jan. 15, 2019 (EP) .................................... 19151907

(51) Int. Cl.
*G01B 11/25* (2006.01)
*G02F 1/01* (2006.01)
*G02F 1/33* (2006.01)

(52) U.S. Cl.
CPC ........ *G01B 11/2513* (2013.01); *G02F 1/0136* (2013.01); *G02F 1/33* (2013.01)

(58) Field of Classification Search
CPC ............ G01B 11/2513; G01B 2210/56; G02F 1/0136; G02F 1/33; G01N 21/956;
(Continued)

(56) References Cited

U.S. PATENT DOCUMENTS 4,988,202 A 1/1991 Nayar et al.
5,703,692 A 12/1997 McNeil et al.
(Continued)

FOREIGN PATENT DOCUMENTS

EP 1628164 A2 2/2006
JP H09 138198 A 5/1997
(Continued)

OTHER PUBLICATIONS

International Search Report and Written Opinion of the International Searciting Authority directed to related International Patent Application No. PCT/EP2019/070599, dated Oct. 16, 2019; 11 pages.
(Continued)

*Primary Examiner* — Roy M Punnoose
(74) *Attorney, Agent, or Firm* — Sterne, Kessler, Goldstein & Fox P.L.L.C.

(57) ABSTRACT

A metrology apparatus for determining a characteristic of interest of a structure on a substrate, the apparatus comprising: a radiation source configured to generate illumination radiation; at least two illumination branches comprising at least one optical fiber and configured to illuminate a structure on a substrate from different angles; and a radiation switch configured to receive the illumination radiation and transfer at least part of the radiation to a selectable one of the at least two illumination branches.

20 Claims, 10 Drawing Sheets

(58) Field of Classification Search
CPC .............. G01N 21/47; G01N 21/8806; G01N 2021/8816; G01N 2021/8848; G03F 7/70616
See application file for complete search history.

(56) References Cited

U.S. PATENT DOCUMENTS

| | | | |
|---|---|---|---|
| 6,034,978 | A | 3/2000 | Ujazdowski et al. |
| 6,201,601 | B1 | 3/2001 | Vaez-Iravani et al. |
| 6,952,253 | B2 | 10/2005 | Lof et al. |
| 7,068,363 | B2 | 6/2006 | Bevis et al. |
| 7,656,529 | B1 * | 2/2010 | Nikoonahad ....... G03F 7/70633 356/400 |
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 8,896,832 | B2 | 11/2014 | Hill et al. |
| 10,895,452 | B2 * | 1/2021 | Van Dam ............. G03F 7/70616 |
| 2004/0218179 | A1 | 11/2004 | Norton et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0141730 | A1 | 6/2013 | Quintanilha |
| 2013/0162996 | A1 | 6/2013 | Straaijer et al. |
| 2014/0078296 | A1 * | 3/2014 | Mamiya ............ G01B 11/2513 348/135 |
| 2014/0232850 | A1 * | 8/2014 | Park .................. G01B 11/0608 348/92 |
| 2016/0161863 | A1 | 6/2016 | Den Boef et al. |
| 2016/0370717 | A1 | 12/2016 | Den Boef et al. |
| 2020/0072599 | A1 * | 3/2020 | Van Dam ............. G01N 21/956 |

FOREIGN PATENT DOCUMENTS

| | | |
|---|---|---|
| TW | I477758 B | 3/2015 |
| WO | WO 2011012624 A1 | 2/2011 |

OTHER PUBLICATIONS

Notice of Allowance directed to U.S. Appl. No. 16/558,457, dated Aug. 6, 2020; 9 pages.
Notice of Allowance directed to U.S. Appl. No. 16/558,457, dated Sep. 18, 2020; 10 pages.

* cited by examiner

METROLOGY APPARATUS

CROSS-REFERENCE TO RELATED APPLICATIONS

This application is a continuation application of U.S. patent application Ser. No. 16/558,457 filed on Sep. 3, 2019, which claims priority to European Patent Application 19151907.3 filed on Jan. 15, 2019, and European Patent Application 18192442.4 filed on Sep. 4, 2018, the entire contents of all of which are incorporated herein by references.

FIELD

The present invention relates to a metrology apparatus for determining a parameter of interest of a structure on a substrate and a method for determining the parameter of interest.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

A metrology apparatus can be used to measure parameters of interest of structures on the substrate. For example, a metrology apparatus can be used to measure parameters such as critical dimension, overlay between layers on the substrate and asymmetry of a pattern on the substrate. Rays of measurement radiation are used to illuminate the substrate. The radiation is diffracted by the structure on the substrate. The diffracted radiation is collected by an objective lens and captured by a sensor.

The intensity of illumination may be limited by the power of the radiation source and losses in the optical system of the metrology apparatus. The objective lens may have a high numerical aperture, such as about 0.95. The metrology apparatus may require complicated optics downstream of the objective lens, for example to reduce aberrations in the collected diffracted radiation.

SUMMARY

It is an aim to provide a metrology apparatus that can have higher intensity illumination and/or that can perform faster measurements.

According to an aspect of the invention, there is provided a metrology apparatus for determining a characteristic of interest of a structure on a substrate. According to another aspect, a method for determining a parameter of interest of a structure on a substrate is provided. The metrology apparatus comprises: a radiation source for generating illumination radiation; at least two illumination branches for illuminating the structure on the substrate, the illumination branches being configured to illuminate the structure from different angles; and a radiation switch configured to receive the illumination radiation and transfer at least part of the radiation to a selectable one of the at least two illumination branches. Wherein the radiation switch comprises a Pockels cell configured to control a polarization direction of the illumination radiation and to output polarization controlled illumination radiation, and a polarizing beam splitter optically downstream of the Pockels cell and configured to, depending on the polarization direction of the polarization controlled illumination radiation, transmit the polarization controlled illumination radiation to a first one of the at least two illumination branches or reflect the polarization controlled illumination radiation to a second one of the illumination branches.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
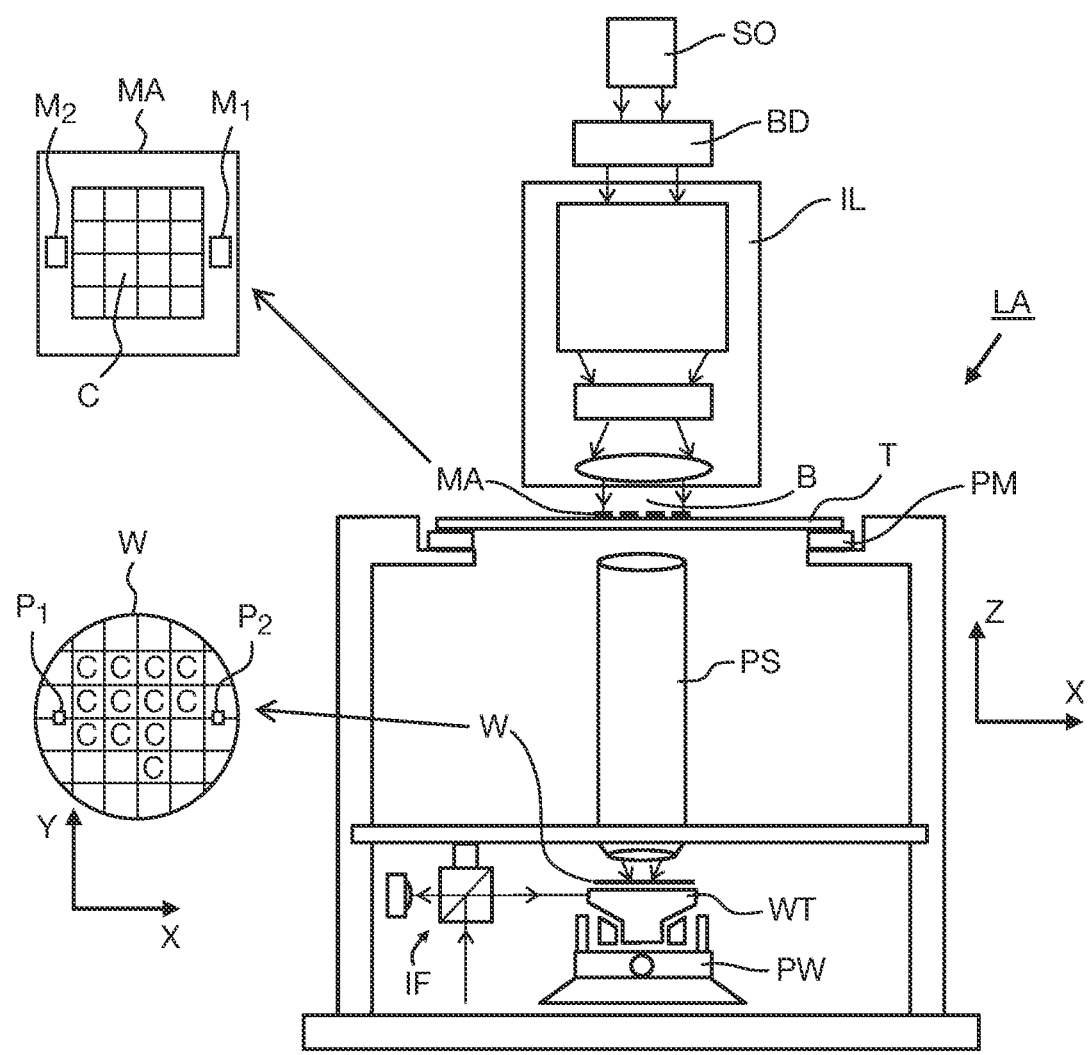
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks $M_1$, $M_2$ and substrate alignment marks $P_1$, $P_2$. Although the substrate alignment marks $P_1$, $P_2$ as illustrated occupy dedicated target portions, they may be located in spaces between target portions. Substrate alignment marks $P_1$, $P_2$ are known as scribe-lane alignment marks when these are located between the target portions C.

Figure 2:
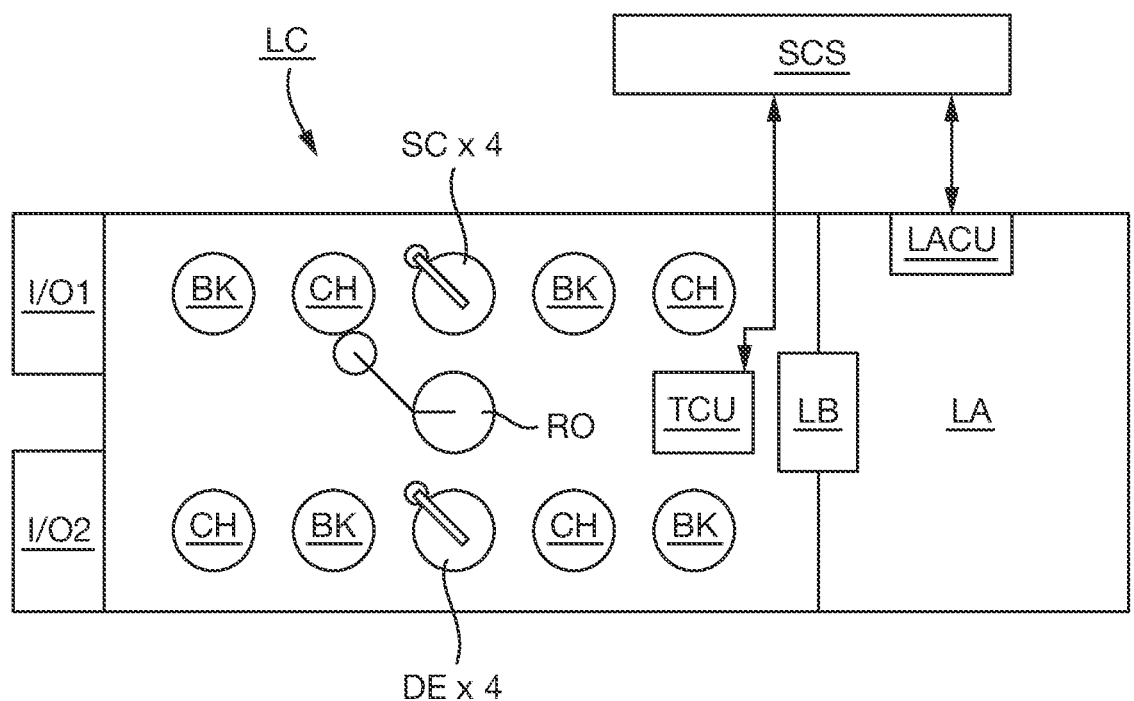
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
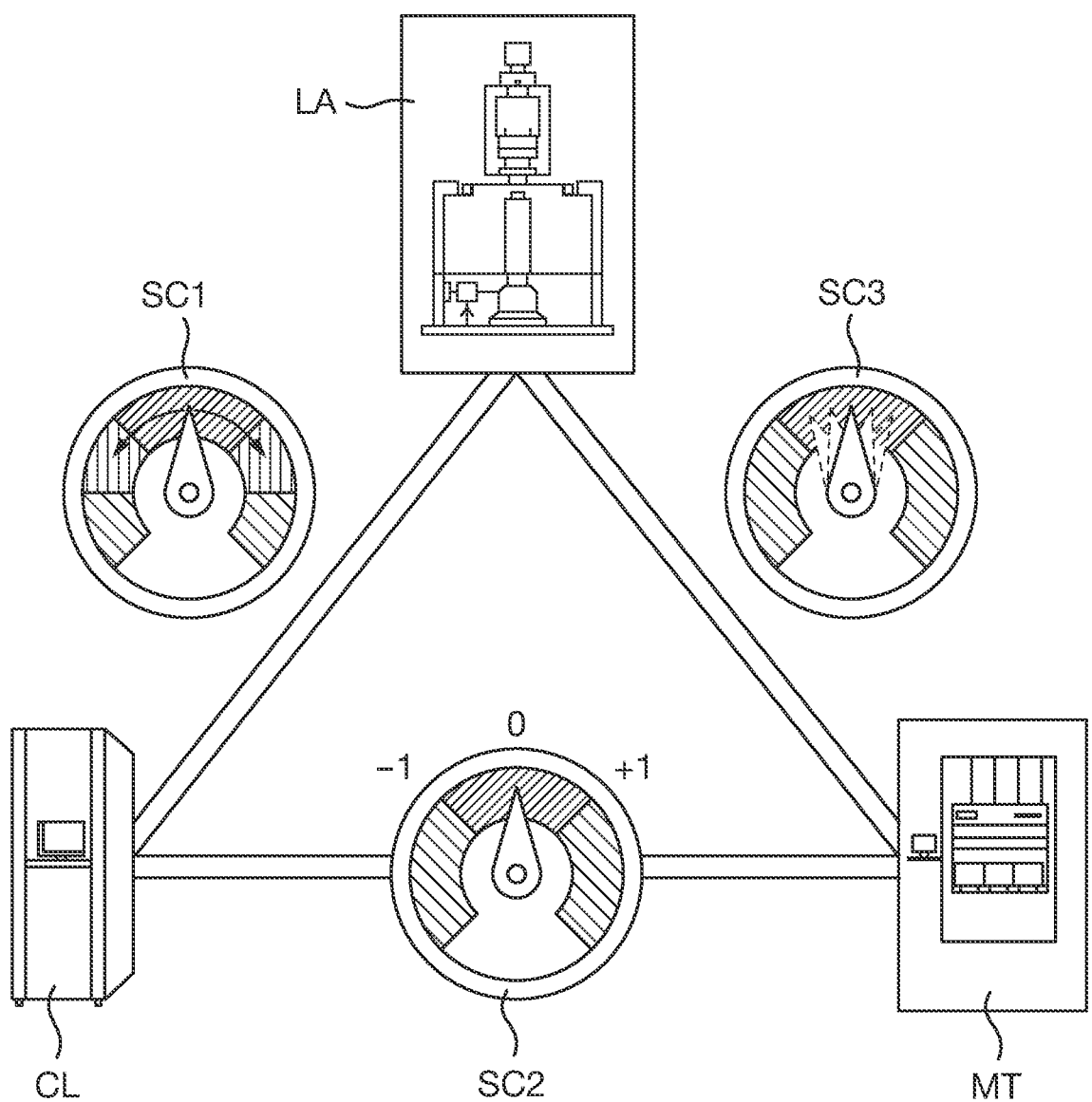
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology apparatus MT (a second system) of the present invention and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology apparatus MT) to predict whether defects may be present due to e.g. sub-optimal processing (depicted in FIG. 3 by the arrow pointing "0" in the second scale SC2).

The metrology apparatus MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Different types of metrology apparatus MT for making such measurements are known, including scanning electron microscopes or various forms of scatterometer metrology apparatus MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range. The metrology apparatus MT of the present invention may be a diffraction based scatterometer.

In a first embodiment, the metrology apparatus MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the metrology apparatus MT is a spectroscopic scatterometer. In such spectroscopic scatterometer, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the metrology apparatus MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the metrology apparatus MT, the metrology apparatus MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

The structure on the substrate Which is the metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 4:
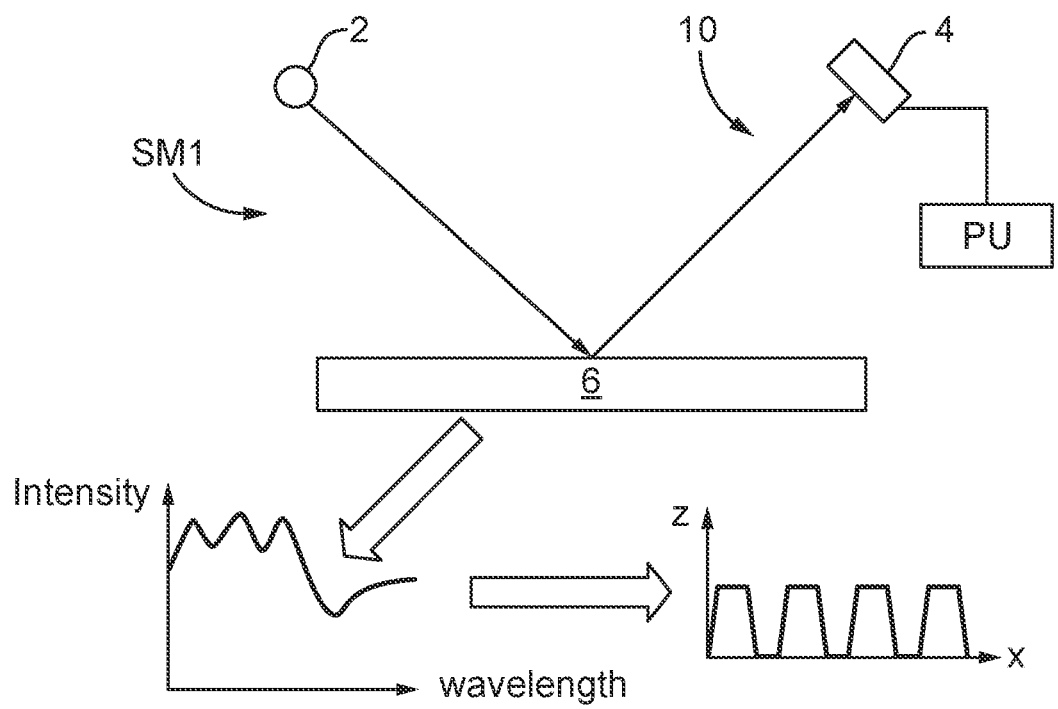
FIG. 4 schematically shows how a parameter if interest of a structure on a substrate may be determined according to an embodiment of the invention.

According to an embodiment of the invention a metrology apparatus MT, such as a scatterometer, is depicted in FIG. 4. It comprises a broadband (white light) radiation projector 2 which projects radiation onto a substrate 6. The reflected or scattered radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by a processor PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

For better understanding of the invention, a metrology apparatus according to a comparative example is described below with reference to FIG. 5.

Figure 5A:
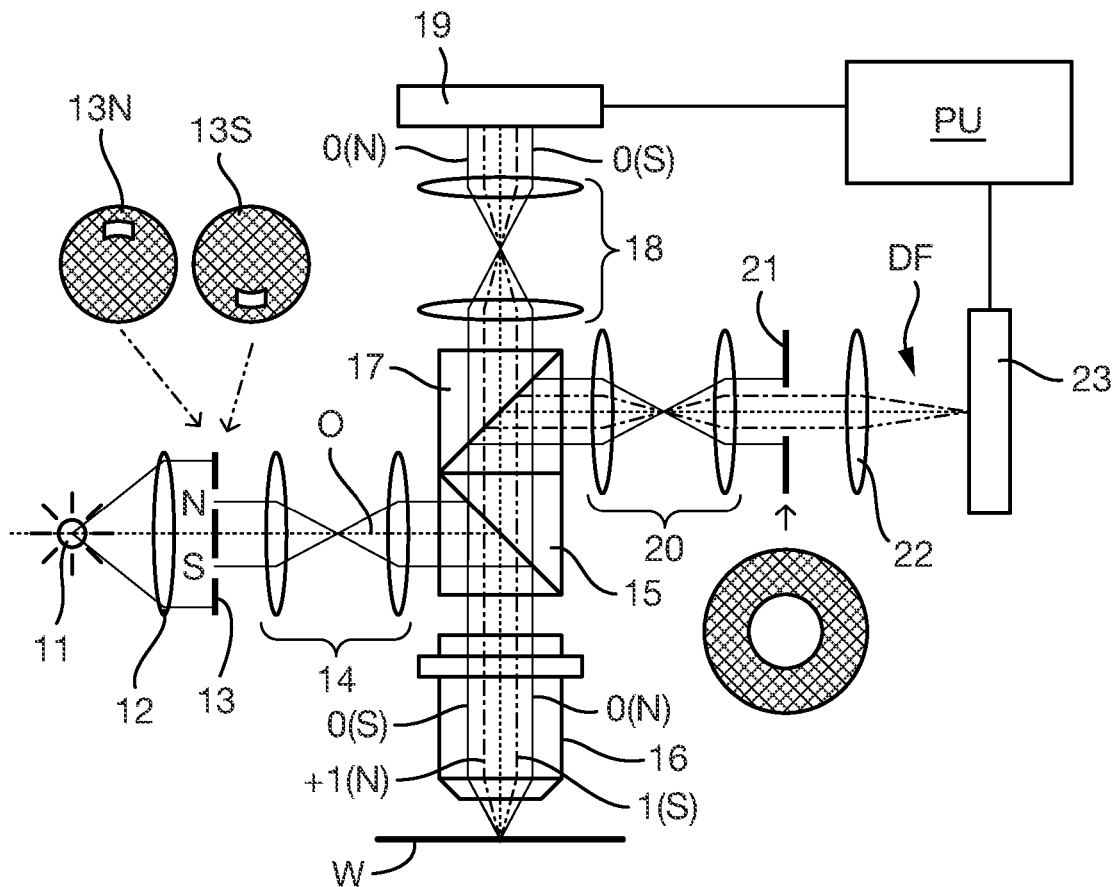
FIGS. 5(a)-5(d) comprise 5(a) a schematic diagram of a dark field scatterometer according to a comparative example for use in measuring targets using a first pair of illumination apertures, 5(b) a detail of diffraction spectrum of a target grating for a given direction of illumination 5(c) a second pair of illumination apertures providing further illumination modes in using the scatterometer for diffraction based overlay measurements and 5(d) a third pair of illumination apertures combining the first and second pair of apertures.

FIG. 5(a) presents of a metrology apparatus according to a comparative example and, more specifically, a dark field scatterometer. A target TT and diffracted rays of measurement radiation used to illuminate the target are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labelled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labelled 'south'. Other modes of illumination are possible by using different apertures. The rest of the pupil plane is desirably dark as any unnecessary light outside the desired illumination mode will interfere with the desired measurement signals.

Figure 5B:
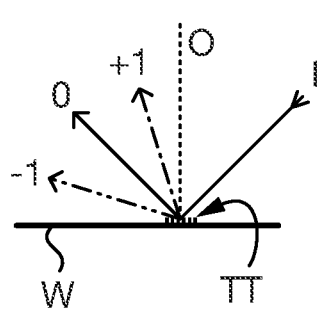
Figure 5C:
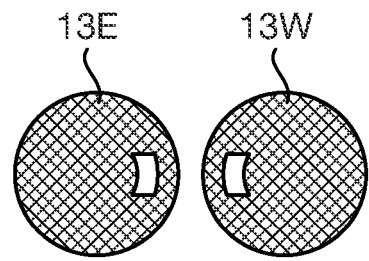
Figure 5D:
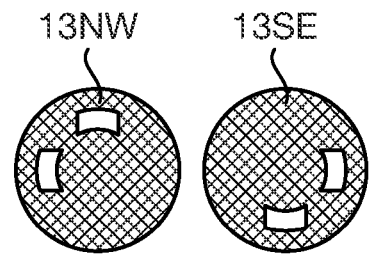

As shown in FIG. 5(b), target TT is placed with substrate W normal to the optical axis O of objective lens 16. The substrate W may be supported by a support (not shown). A ray of measurement radiation I impinging on target TT from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target TT and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 5(a) and 5(b) are shown somewhat off axis, purely to enable them to be more easily distinguished in the diagram.

At least the 0 and +1 orders diffracted by the target TT on substrate W are collected by objective lens 16 and directed back through beam splitter 15. Returning to FIG. 5(a), both the first and second illumination modes are illustrated, by designating diametrically opposite apertures labelled as north (N) and south (S). When the incident ray I of measurement radiation is from the north side of the optical axis, that is when the first illumination mode is applied using aperture plate 13N, the +1 diffracted rays, which are labelled +1(N), enter the objective lens 16. In contrast, when the second illumination mode is applied using aperture plate 13S the −1 diffracted rays (labelled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target TT on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 4(c) and (d). The use of these, and numerous other variations and applications of the apparatus are described in prior published applications, mentioned above.

The rays of measurement radiation are provided by light emitted by the source 11. This light is directed onto the substrate W via the beam splitter 15 and the objective lens 16 that collects the diffracted radiation from the substrate W.

The target TT may comprise two gratings of lines in a first direction (e.g. the X direction) and two gratings of lines in a second direction (e.g. the Y direction) orthogonal to the first direction. The objective lens 16 is required to have a high numerical aperture NA, e.g. about 0.95, in order to collect the radiation diffracted from the gratings. As shown in FIG. 5, a large number of optical elements are required between the objective lens 16 and the sensors 19 and 23.

It would be good to have a metrology apparatus that can have higher intensity illumination and/or that can perform faster measurements. It would be good to have a metrology apparatus that has lower requirements for the numerical aperture of the detection lens (e.g. the objective lens 16 in the metrology apparatus of FIG. 5). It would be good to have a metrology apparatus with simplified detection optics.

Figure 6:
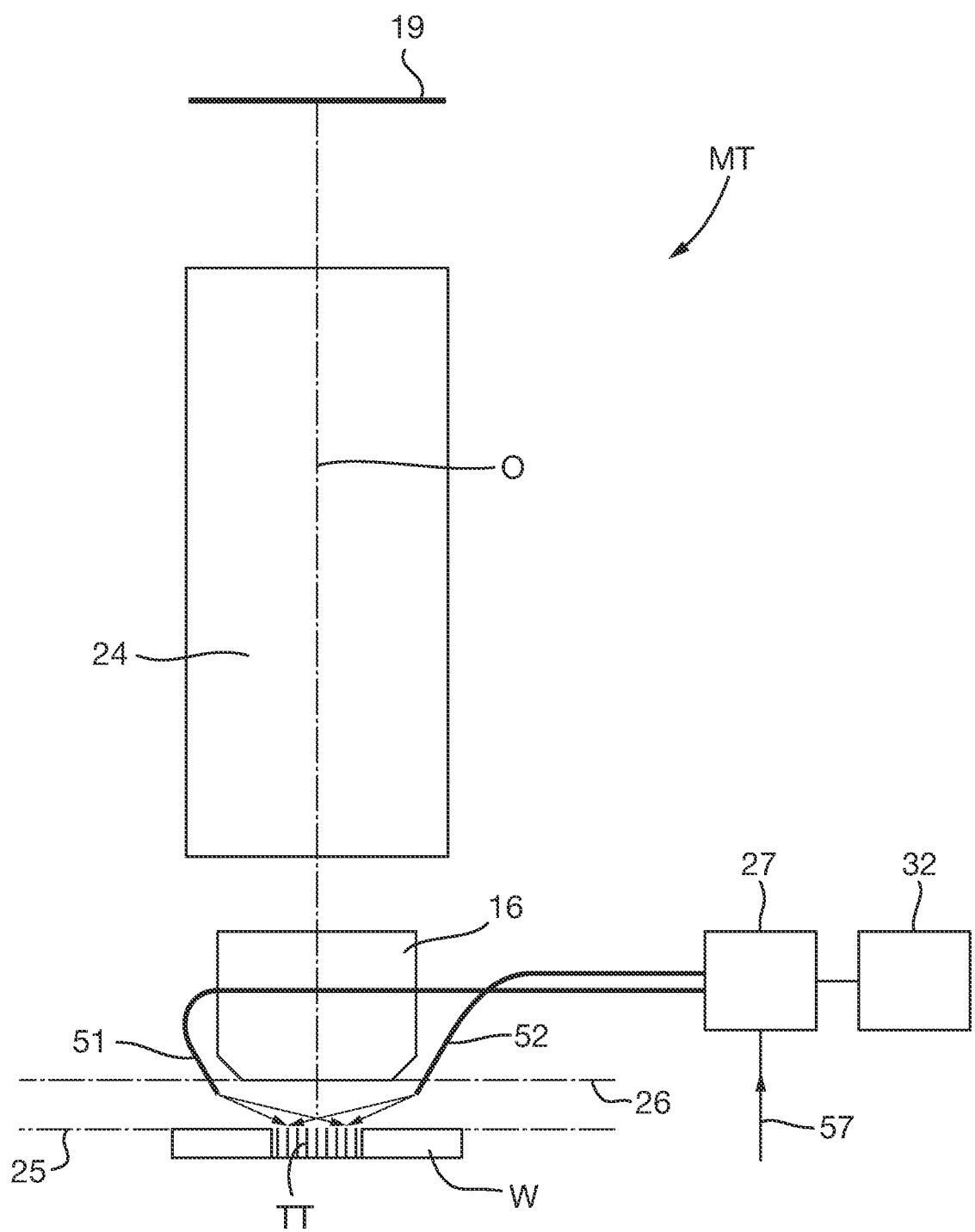
FIG. 6 shows a metrology apparatus according to an embodiment of the invention.

FIG. 6 schematically depicts a metrology apparatus MT according to an embodiment of the invention. The metrology apparatus MT is for determining a parameter of interest of a structure on a substrate W. The structure is a metrology target TT.

In an embodiment, the metrology apparatus MT comprises a radiation source 32. The radiation source 32 is for generating illumination radiation. For example, in an embodiment the radiation source 32 is a laser, such as a white light laser. The radiation source 32 may comprise a least one photonic crystal fiber for transmitting the illumination radiation. However, it is not essential for the radiation source 32 to be a white light laser. Other types of laser, or non-laser source may be used as the radiation source 32.

As depicted in FIG. 6, in an embodiment the metrology apparatus MT comprises at least two illumination branches 51, 52. The at least two illumination branches 51, 52 are for illuminating the target TT on the substrate W. The illumination branches 51, 52 are configured to illuminate the target TT from different angles, as shown in FIG. 6 for example. The number of illumination branches is not limited to two. For example, there may be three, four or more illumination branches.

The illumination branches 51, 52 represent different optical paths for illumination radiation to reach the target TT.

The illumination radiation transmitted through the illumination branches 51, 52 is provided by the radiation source 32. The illumination branches 51, 52 are alternative ways for the illumination radiation from the radiation source 32 to be directed to the target TT.

As depicted in FIG. 6, in an embodiment the metrology apparatus MT comprises a radiation switch 27. The radiation switch 27 is a switching element. The radiation switch 27 is configured to receive the illumination radiation from the radiation source 32. The radiation switch 27 is configured to transfer at least part of the radiation to a selectable one of the at least two illumination branches 51, 52.

For example, the radiation switch 27 can be switched between different modes of operation. In a first mode, the radiation switch 27 is configured to receive the illumination radiation and transfer at least part of the radiation to a first illumination branch 51. In a second mode, the radiation switch 27 is configured to receive the illumination radiation and transfer at least part of the radiation to a second illumination branch 52. The first mode corresponds to when the first illumination branch 51 is selected. The second mode corresponds to when the second illumination branch 52 is selected. As shown in FIG. 6, in an embodiment the radiation switch is configured to receive a control signal 57 that can be used to select the modes.

In an embodiment, the target TT is sequentially illuminated by the at least two illumination branches 51, 52 from different angles. In a first time period, the target TT is illuminated by illumination radiation from the first illumination branch 51. In a second time period (subsequent to the first time period) the target TT is illuminated by illumination radiation from the second illumination branch 52. In an embodiment, the first time period does not overlap with the second time period. In an embodiment, the second time period follows substantially immediately after the first time period, with substantially no gap between.

In an embodiment, the two illumination branches 51, 52 correspond to complementary angles. For example, if the first illumination branch 51 illuminates the target TT from a first angle, then the second illumination branch 52 illuminates the target TT from the complementary angle of 180° from the first angle when viewed along the normal to the target TT (i.e. the top view shown in FIG. 9). In particular, in an embodiment the first illumination branch 51 is for making a dark field measurement from the target TT (with a single orientation, e.g. X orientation) wherein a first diffraction order is collected by the detection lens 16. The second illumination branch 52 is for making a dark field measurement from the same target TT with the same orientation, but the complementary diffraction order is collected by the detection lens 16.

Figure 9:
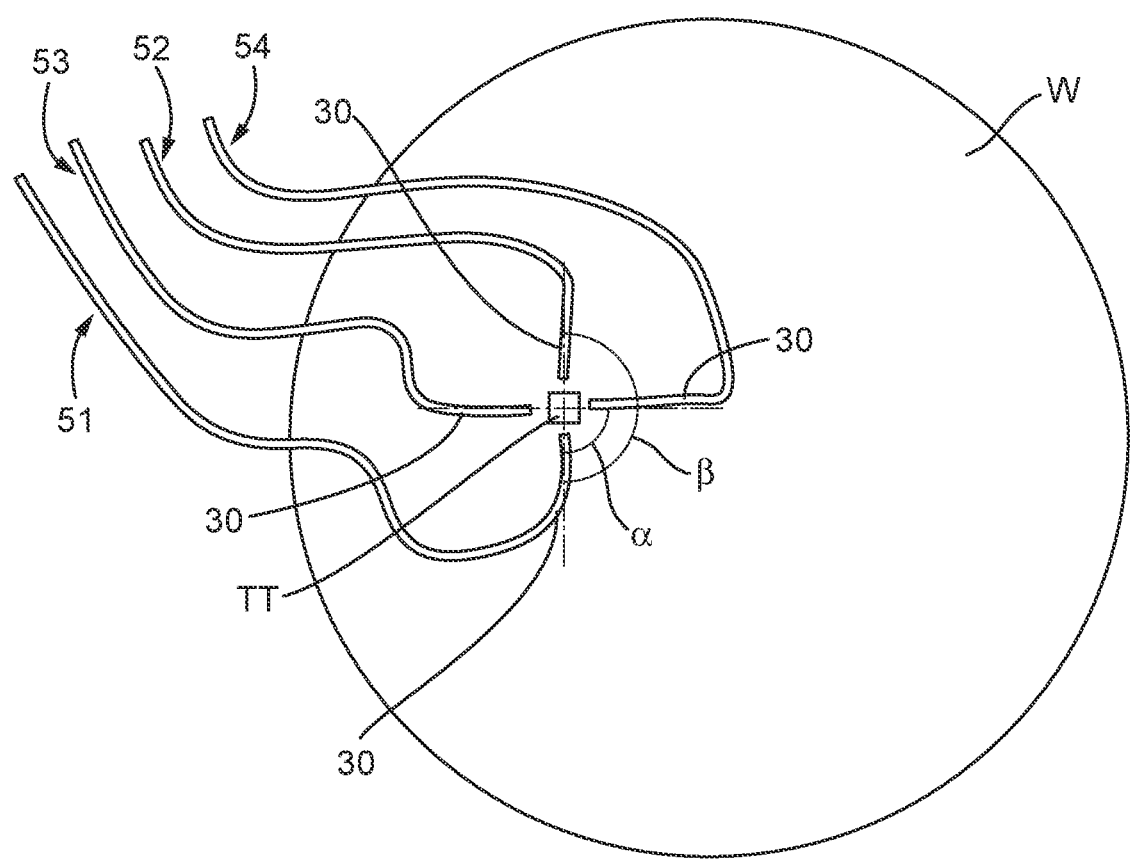
FIG. 9 is a top view of illumination branches illuminating a structure according to an embodiment of the invention.

Referring to FIG. 9, in an embodiment different illumination branches 51, 53 are for determining the characteristic of interest of different gratings of the target TT. For example, the first illumination branch 51 may be for making measurements of radiation diffracted from gratings in the X direction. Another illumination branch 53 may be for measuring radiation diffracted from gratings in the Y direction.

According to the present invention, measurements from normal and complementary angles can be made sequentially. Additionally or alternatively, measurements for gratings in different directions can be made sequentially. This means that it is not necessary for the diffracted radiation for these different measurements to be collected simultaneously by the detection lens 16. Instead, the detection lens 16 may collect the radiation for only one of these measurements at a time.

An embodiment of the invention is expected to achieve a metrology apparatus MT that has a lower NA for the detection lens 16. In an embodiment, the detection lens 16 has an NA of no more than 0.9, optionally no more than 0.8, optionally no more than 0.7, optionally no more than 0.6, optionally no more than 0.5 and optionally no more than 0.4. The detection lens 16 is part of the detection branch of the metrology apparatus MT. The detection lens 16 is configured to collect a portion of the scattered/reflected radiation and to transmit it in a direction towards the sensor 19. An embodiment of the invention is expected to achieve a greater level of design freedom for the detection lens 16 of the metrology apparatus MT. For example, a lens that is simpler or cheaper to manufacture can be used.

As explained above, a radiation switch 27 is provided to transfer radiation to the illumination branches 51, 52 in turn. In an embodiment the radiation switch 27 is configured to switch between illumination branches in less than 1 ms. The fast switching providing by the radiation switch 27 allows the measurements to be made sequentially within a limited period of time. An embodiment of the invention is expected to enable a high speed sequential measurement of the normal and complementary modes for gratings in the X direction and the Y direction of the target TT.

In an embodiment, the radiation switch 27 comprises a spatial light modulator. The spatial light modulator is configured to receive the illumination radiation from the radiation source 32. The spatial light modulator is configured to apply a spatially varying modulation to the illumination radiation. In an embodiment, the spatial light modulator comprises a micromirror device. The micromirror device comprises a plurality of microscopically small mirrors. The mirrors are microelectromechanical systems. The orientation of the mirrors is controlled by applying a voltage between two electrodes around the mirror arrays. The orientation of the mirrors can be controlled so as to transfer the illumination radiation to a selectable one of the at least two illumination branches 51, 52. In an embodiment, the spatial light modulator is electrically addressed such that the image on the spatial light modulator is created and changed electronically. In an alternative embodiment, the spatial light modulator is optically addressed such that the image on the spatial light modulator is created and changed by shining light encoded with an image on its front or back surface.

The spatial light modulator transfers the illumination radiation to the illumination branches 51, 52 with low losses. An embodiment of the invention is expected to achieve a high brightness illumination of the target TT. It may be desirable to perform the measurements of the target TT using radiation of different wavelengths. The spatial light modulator can transfer illumination radiation over a wide range of wavelengths.

As mentioned above, the target TT may be sequentially illuminated by illumination radiation from different angles (by using the different illumination branches 51, 52). After the measurements have been made using illumination radiation from the full set of different angles, the wavelength of the illumination radiation may be changed. Following the change in wavelength, the measurements at the different angles may be repeated. Another full set of measurements using the different angles can be made at the changed wavelength. These operations may be completed so as to obtain sets of measurements corresponding to different wavelengths of radiation illuminated at different angles. The spatial light modulator may be configured to deal with the full range of wavelengths of illumination radiation. In an embodiment, the wavelength of illumination radiation may be changed about ten times during a measurement procedure.

However, it is not necessary for the radiation switch 27 to comprise a spatial light modulator. Other form of radiation switch 27 can be used. For example, in an embodiment the radiation switch 27 comprises an acousto-optic deflector. An acousto-optic deflector may also be called a Bragg cell. The acousto-optic deflector uses the acousto-optic effect to diffract and shift the frequency of the illumination radiation using sound waves. For example, in an embodiment the acousto-optic deflector comprises non-linear crystals. The acousto-optic deflector is configured to change the optical properties of a material (e.g. the non-linear crystals) by providing an electromagnetic signal or an acoustic signal. By controlling the way that the acousto-optic deflector changes the optical properties of the material, the illumination radiation can be directed to a selectable one of the at least two illumination branches 51, 52.

The acousto-optic deflector has a smaller number of mechanical moving parts (possibly no mechanical moving parts). An embodiment of the invention is expected to achieve high reliability of illumination branch selection with a long lifetime.

Neither the spatial light modulator nor the acousto-optic deflector is essential to the invention. Additionally or alternatively, in an embodiment the radiation switch 27 comprises at least one beam splitter and a plurality of shutters configured to control transfer of the radiation to a selectable one of the at least two illumination branches 51, 52.

The spatial light modulator and the acousto-optic deflector can transfer the illumination radiation to the illumination branches 51, 52 with low losses. In particular, it is not necessary to split the illumination radiation into different paths and then intentionally cut of some of the paths (thereby losing that radiation). Instead, substantially all of the radiation can be directed along the desired optical path.

Figure 11:
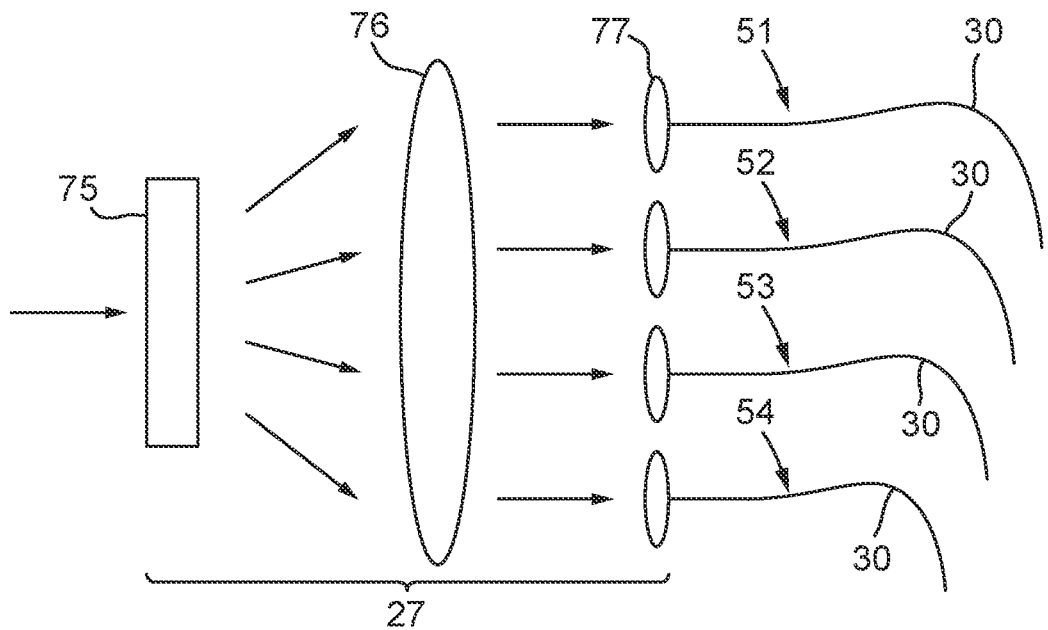
FIG. 11 schematically depicts part of a metrology apparatus according to an embodiment of the invention.

FIG. 11 schematically depicts part of a metrology apparatus MT according to an embodiment of the invention. In the embodiment shown in FIG. 11, the radiation switch 27 comprises an acousto-optic deflector 75. The acousto-optic deflector 75 is configured to redirect (i.e. deflect) light into various angles. The acousto-optic deflector 75 is configured to deflect light in different directions. The reflection angle depends on the driving frequency and/or power with which the acoustic waves are excited in the material. In an embodiment, the acousto-optic deflector 75 is configured to deflect radiation in the range form 400 nm to 1600 nm.

In an embodiment, a controller is configured to control the driving frequency and/or power for exciting acoustic waves in the material of the acousto-optic deflector 75. The range of angles over which the acousto-optic deflector 75 can redirect light is not particularly limited. In an embodiment, the acousto-optic deflector 75 is configured to deflect light over a range of angles, the range being 0.5 to 1.5.

As shown in FIG. 11, in an embodiment the radiation switch 27 comprises a focal lens 76. The focal lens 76 is configured to receive light deflected by the acousto-optic deflector 75 and direct the light to the illumination branches 51-54. The deflection angles provided by the acousto-optic deflector 75 and the focal length of the focal lens 76 can be selected so as to provide a sufficiently large spatial deflection of the light beams. For example, in an embodiment the focal lens 76 may have a focal length of about 60 mm. If the acousto-optic deflector 75 deflects the light over a range of angles 1 or wider and the focal lens 76 has a focal length of 60 mm, then the spatial displacement of light beams can be about 1 mm.

As shown in FIG. 11, in an embodiment the radiation switch 27 comprises a lens array 77. The lens array is configured to couple the radiation beams from the acousto-optic deflector 75 to optical fibers 30 corresponding to the illumination branches 51-54. In an embodiment, the lens array 77 comprises a plurality of lenses. In an embodiment, the lens array 77 comprises a lens corresponding to the optical fiber 30 of each illumination branch 51-54. In an embodiment, each lens of the lens array 77 has a diameter of at least 1 mm, and optionally at most 2 mm.

The deflection angle applied by the acousto-optic deflector 75 can be controlled varying the frequency and/or power of the acoustic waves excited in the acousto-optic deflector 75. Accordingly, by varying the frequency and/or power input to the acousto-optic deflector 75, the deflection angle can be quickly switched so as to redirect light to selected individual optical fibers 30 of particular illumination branches 51-54. This makes it possible to switch the illumination branch 51-54 in less than 1 ms.

In an embodiment, the radiation switch 27 is configured to vary the intensity of radiation applied to the illumination branches 51-54. For example, the radiation switch 27 may be configured to vary the illumination intensity between a medium intensity and a high intensity, for example. This is explained in further detail below.

In an embodiment, the acousto-optic deflector is configured to vary a direction of a radiation beam so as to control how much of the radiation beam couples to an optical fiber 30 of a corresponding illumination branch 51-54. The individual intensity applied to the illumination branches 51-54 can be adjusted by detuning the deflection angles provided by the acousto-optic deflector 75. When a high intensity of radiation is desired, the acousto-optic deflector 75 is configured to provide a deflection angle such that the radiation beam is applied to the center of the optical fiber 30 of the particular illumination branch 51. By directing the radiation beam to the center of the optical fiber 30, the illumination intensity can be maximized (or nearly maximized).

If a lower intensity of radiation is required, then the acousto-optic deflector 75 can be controlled so as to apply a slightly different deflection angle such that the radiation beam is directed to an off-center position (in the cross-sectional area) of the optical fiber 30. This results in a reduction of the amount of radiation that is coupled into the optical fiber 30. This decreases the intensity of the radiation that is transferred through the optical fiber 30 of the illumination branch 51. In this way, the individual intensities can be adjusted by slightly detuning the angles so that the spots formed on the tip of the optical fiber 30 is off-center and less light is coupled into the optical fiber 30.

This way, small intensity imbalances in the beams transported along the different illumination branches 51-54 can be adjusted and corrected for. For example, if the energy sensors 55 indicate an intensity imbalance between the illumination branches 51-54, then the acousto-optic deflector 75 can be controlled so as to vary the deflection. This can compensate for the intensity imbalances and increase the consistency of the intensity across the illumination branches 51-54.

Figure 8:
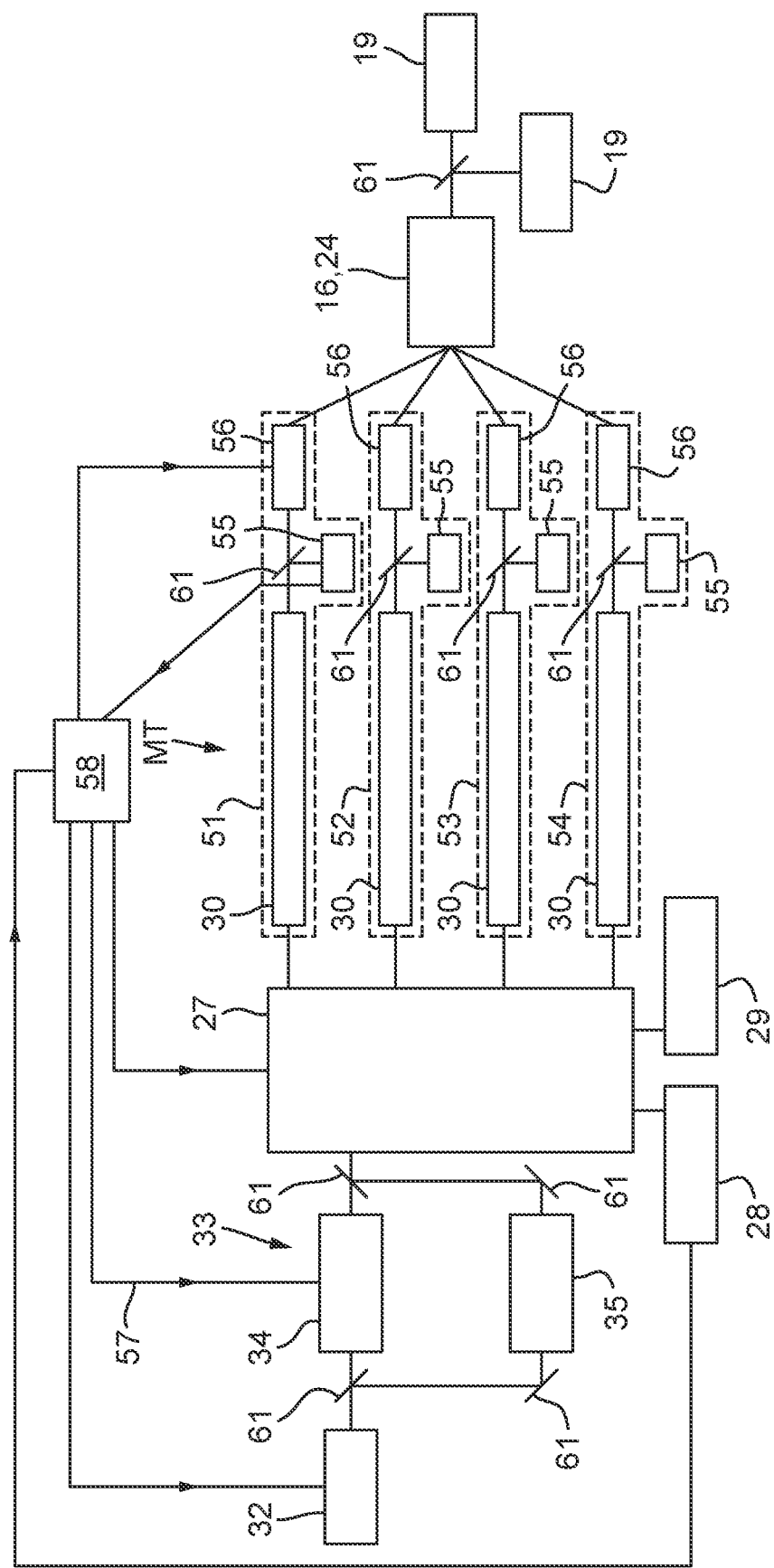
FIG. 8 schematically shows optical connections between components of a metrology apparatus according to an embodiment of the invention.

It is to be noted that the use of an acousto-optic deflector 75 to vary the intensity of illumination may be combined with the features of the above described embodiment shown in FIG. 8. The use of an acousto-optic deflector 75 to vary the intensity of illumination can also be used independently of the other features shown in FIG. 8.

Figure 10:
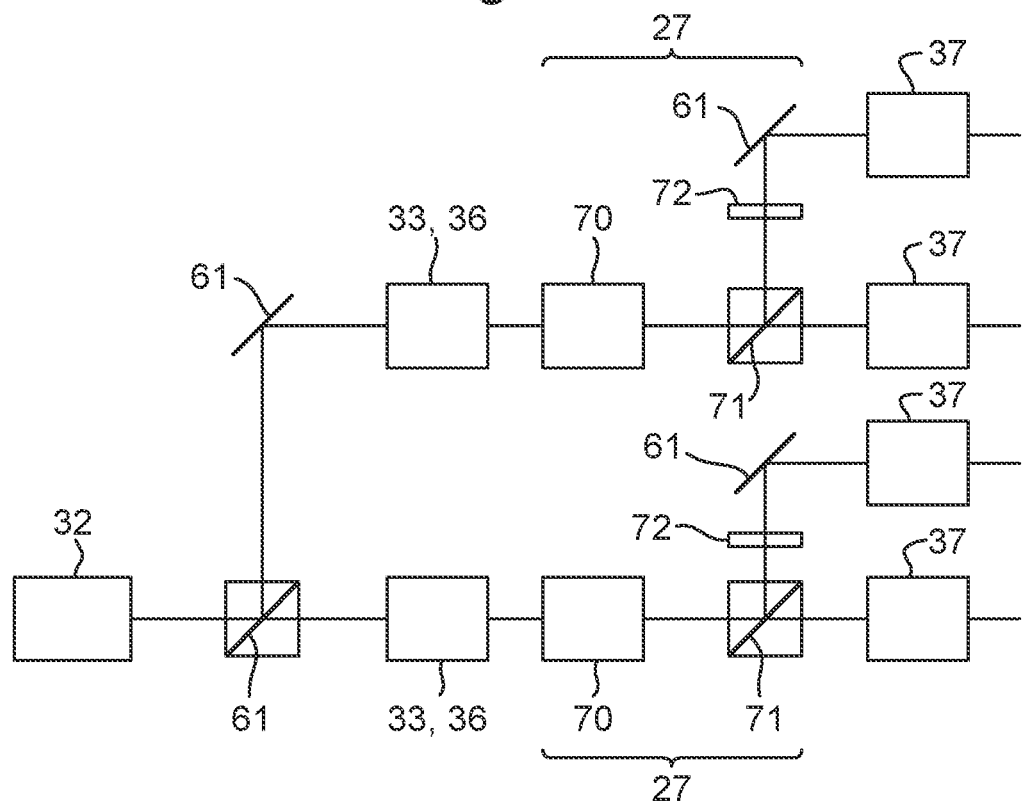
FIG. 10 schematically depicts part of a metrology apparatus according to an embodiment of the invention.

FIG. 10 schematically depicts part of a metrology apparatus MT according to an embodiment of the invention. In the embodiment shown in FIG. 10, the radiation switch 27 comprises at least one Pockels cell 70. The Pockels cell 70 is an electro-optic component configured to control a polarization direction of a radiation beam. The Pockels cell is configured such that it produces a birefringence in an optical medium induced by an electric field. The birefringence depends on the electric field. When a voltage is applied over a crystal of the Pockels cell 70 its amount of birefringence changes. In particular, the amount of birefringence may change linearly with respect to the applied voltage. The Pockels cell 70 functions as a variable retarder The voltage applied to the Pockels cell 70 is controlled such that the Pockels cell 70 applies a variable retardance. The variable retarder affects the polarization direction of radiation input into the Pockels cell 70. By controlling the polarization direction of the radiation, the radiation can be directed to different illumination branches 51-54, as explained in more detail below.

As shown in FIG. 10, in an embodiment the metrology apparatus MT comprises a beam splitter 61 configured to receive radiation from the radiation source 32. The beam splitter 61 is configured to direct the radiation along two different branches. It is not essential for the beam splitter 61 to be provided. In an alternative embodiment, the radiation is directed from the radiation source 32 along one of the two branches shown in FIG. 10 (i.e. with only one Pockels cell 70). The other branch (with the other Pockels cell 70) is optional.

In an embodiment, the wavelength selector 33 comprises an acousto-optic tunable filter 36 configured to transmit the illumination radiation of the selected wavelength range based on a frequency and/or power of acoustic waves excited in the acousto-optic tunable filter 36. In particular, as shown in FIG. 10, in an embodiment the metrology apparatus MT comprises at least one acousto-optic tunable filter 36. The acousto-optic tunable filter 36 may form part of the wavelength selector 33. The acousto-optic tunable filter 36 is configured to select the wavelength of radiation that is transmitted by the acousto-optic tunable filter 36. In an embodiment, the acousto-optic tunable filter 36 has a bandwidth of about 3 nm.

The acousto-optic tunable filter 36 is configured to linearly polarize the radiation. The radiation output by the acousto-optic tunable filter 36 is linearly polarized. The linearly polarized radiation is input into the Pockels cell 70, which is downstream of the acousto-optic tunable filter 36.

As mentioned above, the Pockels cells functions as a variable retarder. The Pockels cell 70 is configured such that the "fast" and "slow" axes of the retarder are arranged at 45° relative to the polarization plane of the linearly polarized radiation received by the Pockels cell 70. When the voltage applied to the Pockels cell 70 is such that the retarder is at 0°, than the polarization of the radiation is unchanged by the Pockels cell 70. However, when the voltage applied to the Pockels cell 70 is controlled such that the retarder is at 180°, then the polarization direction of the radiation is rotated by 90°. The voltage applied to the Pockels cell 70 can be varied in less than 1 ms, such that the switching of polarization direction can be done in less than 1 ms.

The voltage that is needed to be applied to the Pockels cell 70 in order to provide a retardance of 180° depends on the wavelength of the radiation. Accordingly, the wavelength of the radiation is an input of the controller that controls the voltage applied to the Pockels cell 70 so as to control the polarization direction of radiation output by the Pockels cell 70.

As shown in FIG. 10, in an embodiment the radiation switch 27 comprises a polarizing beam splitter 71 optically downstream of the Pockels cell 70. The polarizing beam splitter 71 is configured to transmit or reflect a radiation beam depending on the polarization direction controlled by the Pockels cell 70. The radiation output by the Pockels cell 70 enters the polarizing beam splitter 71. Depending on the selected polarization direction of the radiation, the radiation is either transmitted or reflected by the polarizing beam splitter 71. As shown in FIG. 10, in an embodiment the radiation switch 27 comprises a half wavelength retarder 72. The half wavelength retarder 72 is configured to rotate back the polarization direction of the radiation.

Both the radiation beam transmitted by the polarization beam splitter 71 and the radiation beam reflected by the polarizing beam splitter 71 and subsequently transmitted by the half wavelength retarder 72 then have the same polarization direction. The two beams correspond to two different illumination branches 51, 52. Hence, the radiation switch 27 is configured to control which illumination branch 51, 52 is used by controlling the voltage applied the Pockels cell 70.

In an embodiment, the metrology apparatus MT comprises at least two acousto-optic tunable filters 36-37, at least one arranged upstream of the radiation switch 27 and at least one arranged downstream of the radiation switch 27. In particular, as shown in FIG. 10, in an embodiment each illumination branch 51-54 is provided with a further acousto-optic tunable filter 37. The further acousto-optic tunable filter 37 is configured to switch the beam on and off for the corresponding illumination branch 51-54.

In an embodiment, the further acousto-optic tunable filter 37 has a larger bandwidth compared to the acousto-optic tunable filter 36. By requiring that the radiation passes through two acousto-optic tunable filters 36, 37, the radiation of unwanted wavelengths can be rejected more reliably. A switch provided by such an acousto-optic tunable filter 37 may be applied to other embodiments of the present invention.

As shown in FIG. 10, there may be two branches, each with a Pockels cell 70, so as to provide for illumination branches 51-54 in total. Alternatively, only one branch may be required if only two illumination branches 51, 52 are required.

In an embodiment, the beam splitter 61 immediately downstream of the radiation source 32 is a polarization beam splitter. This makes it possible to create two beams that have an optimum polarization for transmission through the corresponding acousto-optic tunable filter 36. This reduces the amount of energy that would otherwise be lost in the acousto-optic tunable filter 36.

In an embodiment, the light source 32 is a supercontinuum light source.

It is to be noted that the Pockels cell 70 and acousto-optic tunable filters 36-37 may be combined with the features of the above described embodiment shown in FIG. 8. The Pockels cell 70 and acousto-optic tunable filters 36-37 may be can also be used independently of the other features shown in FIG. 8.

In an embodiment, the metrology apparatus MT comprises a detection lens 16. The lens is for collecting at least a portion of radiation diffracted from the structure (i.e. target TT). In an embodiment, the lens is similar to the objective lens 16 described above in the context of the metrology apparatus of FIG. 5. In the description below, the lens is described as an objective lens. However, it is not essential that the lens is an objective lens. As an alternative, the lens may be a single lens. The lens may be a singlet, for example a plano-asphere or a bi-asphere. The lens may be any surface with a free form curvature or a Fresnel lens. The lens may comprise materials with a gradient in refractive index.

In an embodiment, the metrology apparatus MT comprises an image sensor 19. The sensor 19 is for receiving an obtaining a recording of the collected diffracted radiation. The sensor 19 may be similar to the sensor 19 described above in the context of the metrology apparatus shown in FIG. 6.

In an embodiment, the metrology apparatus MT comprises optics 24. The optics 24 are for transmitting the collected diffracted radiation to the sensor 19. The optics 24 may comprise one or more optical elements such as a lens, a beam splitter and an optical mask.

In an embodiment, the illumination branches 51, 52 comprise at least one optical fiber for illuminating the target TT. As shown in FIG. 6, in an embodiment the at least one optical fiber is for illuminating the target TT directly. This means that there need not be any optics between the end of the optical fiber and the target TT. This helps to maintain the coherence of the illumination radiation directed to the target TT.

In the comparative example of a metrology apparatus shown in FIG. 5, the target TT is illuminated by radiation emitted by the source 11 and transmitted through various optical elements including the objective lens 16. An embodiment of the metrology apparatus MT of the present invention is different in that the target TT may be illuminated directly by the optical fiber. This means that when the illumination radiation is emitted from the optical fiber it is not transmitted through further optics such as any lens or beam splitter. In particular, the illumination radiation that is emitted from the optical fiber does not pass through the detection lens 16 before it is incident on the target TT.

However it is not essential for the optical fiber to illuminate the target TT directly. In an embodiment, the at least one optical fiber is for illuminating the structure indirectly via at least one other optical element. For example, an optical element such as a lens, a beam splitter etc. may be provided between the end of the optical fiber and the target TT.

Figure 7:
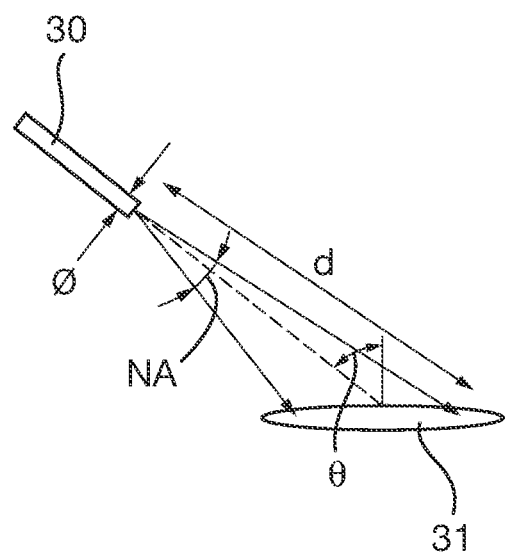
FIG. 7 shows how an illumination spot size is estimated.

FIG. 7 schematically shows the size of the spot 31 of radiation illuminating the target TT. The size of the spot 31 can be estimated using the dimensions show in FIG. 6. The size S of the spot 31 increases with increasing optical fiber diameter φ. The spot 31 may be elliptical having a width and a length. The size S of the spot 31 increases with increasing distance d between the tip 40 of the optical fiber 30 and the target TT. The size S of the spot 31 increases with increasing angle NA representing the spread of rays of radiation emitted from the optical fiber 30. The size S of the spot 31 increases with increasing azimuthal angle θ defined between a normal to the target TT and a central ray of radiation from the optical fiber. In an embodiment, all of the illumination branches 51, 52 illuminate the same area of the target TT. The spots 31 of the different illumination branches 51, 52 overlap each other. In an embodiment, the illumination branches 51, 52 illuminate the target TT at the same azimuthal angle θ. In an embodiment, the optical fibers 30 of the illumination branches 51, 52 have the same diameter.

In an embodiment, the tip 40 of the at least one optical fiber is positioned between the objective lens 16 and the target TT in a direction parallel to the optical axis O. The optical axis O is defined by the detection lens 16. In particular, as shown in FIG. 6, the tip 40 may be positioned in a volume that is limited at one side by a first virtual plane 25 formed by a surface of the substrate W and at another side by a second virtual plane 26 parallel to the first virtual plane and touching an end of the objective lens 16 that faces the substrate W.

An example of the this is shown in FIG. 6, where the optical fibers of the illumination branches 51, 52 extend down to a position below the end face of the detection lens 16. This can help to position the tip 40 of the optical fiber close to the target TT. However it is not essential for the tip 40 to be between the detection lens 16 and the target TT in a direction parallel to the optical axis. For example, the tip 40 could be positioned just above the end face of the detection lens 16, but to one side of it. This could be done while ensuring that the tip 40 does not interfere with any diffracted radiation from the target TT that could be collected by the detection lens 16.

FIG. 8 diagrammatically depicts optical connections between optional components of the metrology apparatus MT. As shown in FIG. 8 and described above, the metrology apparatus MT comprises a radiation source 32 and a radiation switch 27. As shown in FIG. 8, in an embodiment the metrology apparatus MT comprises four illumination branches 51-54. Two of the illumination branches are for determining a characteristic of interest of the first set of gratings of the target TT. Two of the illumination branches are for determining a characteristic of interest of the second set of gratings of the target TT.

As shown in FIG. 8, in an embodiment the metrology apparatus MT comprises a wavelength selector 33. The wavelength selector 33 is configured to receive the illumination radiation. The wavelength selector 33 is configured to transmit the illumination radiation of a selected wavelength range. The wavelength selector 33 is configured to filter out the illumination radiation outside of the selected wavelength range. In an embodiment, the selected wavelength range has a bandwidth of about 5 to 15 nm.

As shown in FIG. 8, in an embodiment the wavelength selector 33 comprises a plurality of selector units 34, 35. In an embodiment, the wavelength selector 33 comprises a visible radiation selector unit 34 and an infrared radiation selector unit 35. The visible radiation selector unit 34 is configured to transmit a selected wavelength range within the visible spectrum and filter out other radiation. The infrared radiation selector 35 is configured to transmit a selected wavelength range within the infrared spectrum and to filter out other radiation. Further selector units may be provided for other sections of the radiation spectrum.

As depicted in FIG. 8, in an embodiment the wavelength selector 33 comprises a beam splitter 61 for splitting the illumination radiation between the selector units 34, 35. In an embodiment, the wavelength selector 33 comprises reflectors 62 (e.g. mirrors) for recombining the split optical paths into a single optical path for input to the radiation switch 27.

As depicted in FIG. 8, in an embodiment the wavelength selector 33 is optically downstream of the radiation source 32 and optically upstream of the radiation switch 27. The wavelength selector 33 receives illumination radiation from the radiation source 32. The wavelength selector 33 outputs illumination radiation of the selected wavelength range to the radiation switch 27. In an alternative embodiment, the wavelength selector 33 is positioned downstream of the radiation switch 27.

It is not essential for the metrology apparatus MT to comprise the wavelength selector 33. In an embodiment the radiation source 32 comprises a single wavelength source (e.g. a single wavelength laser). For example, a wavelength selector is not necessary when the radiation source 32 comprises a single wavelength source. In an embodiment, the radiation source 32 is a tunable single wavelength source of which the output is within a relatively small bandwidth (e.g. single wavelength) and of which the central wavelength of the small bandwidth is selectable.

As shown in FIG. 8, in an embodiment the metrology apparatus MT comprises a spectrometer 28. The radiation switch 27 is configured to selectably transfer at least part of the radiation to the spectrometer 28. The spectrometer 28 is configured to measure spectral components of the illumination radiation. For example, the spectrometer 28 is configured to measure the wavelength range and profile of the illumination radiation. In an embodiment, the spectrometer outputs information which is received by the radiation source 32 and/or the wavelength selector 33 for providing feedback for controlling the wavelength of the illumination radiation.

In an embodiment, the radiation switch 27 is configured to continuously transfer part of the illumination radiation to the spectrometer 28. This allows continuous feedback control of the wavelength of the illumination radiation used for the measurements. In an alternative embodiment, the radiation switch 27 is controlled so as to intermittently transfer at least part of the illumination radiation to the spectrometer 28. This allows intermittent feedback control of the wavelength of the illumination radiation. When the illumination radiation is not being transferred to the spectrometer 28, the brightness of the illumination radiation is maintained high. Feedback can also be done continuously instead of intermittently by splitting off a small portion (e.g. 0.1-1%) of the output of the wavelength selector 33 in a continuous manner.

As shown in FIG. 8, in an embodiment the metrology apparatus MT comprises a beam dump 29. The radiation switch 27 is configured to selectably transfer at least part of the radiation to the beam dump 29. The beam dump 29 is configured to absorb the radiation. The beam dump 29 can be used to prevent the illumination radiation from being emitted by the illumination branches 51-54, without switching off the radiation source 32. The beam dump 29 can be used to act as a shutter for the illumination radiation. However, it is not essential for the metrology apparatus MT to comprise a beam dump. Merely as an example, a metrology apparatus MT may not comprise the beam dump 29 but have a radiation source 32 that can be switched on and off rapidly.

As shown in FIG. 8, in an embodiment the metrology apparatus MT comprises at least two energy sensors 55. In particular, in an embodiment each illumination branch comprises an energy sensor 55. The energy sensors 55 are configured to measure an intensity of the radiation transmitted through the optical fiber 30 of the corresponding illumination branches 51-54.

Each illumination branch 51-54 is provided with a corresponding energy sensor 55. The energy sensor 55 helps to control the intensity of illumination radiation transmitted through the illumination branch 51-54. In an embodiment, the energy sensors 55 output information that is used for feedback control of the intensity of the radiation. For example, the power of the radiation source 32 can be controlled based on information received from the energy sensors 55.

As described above, in an embodiment two illumination branches 51, 52 are used for measuring the first grating (with lines in the X direction). Another two illumination branches 53, 54 are used for measuring the second grating (with lines in the Y direction). The energy sensors 55 can be used to ensure that the intensity of radiation transmitted by the two illumination branches 51, 52 for measuring the same grating is the same for the two branches. Similar control is performed for the two branches for the second grating. In another embodiment, the values measured by the energy sensors 55 are used to normalize intensities measured on the sensor 19 such that measurements can be compared more accurately to each other. An embodiment of the invention is expected to achieve greater accuracy of overlay measurement. This is because the overlay signal is highly sensitive to intensity differences between the two branches that measure the same grating.

As shown in FIG. 8, in an embodiment each illumination branch 51-54 comprises a beam splitter 61 for redirecting radiation towards the energy sensor 55. In an embodiment, the beam splitter 61 is configured to transmit a majority part (e.g. about 99%) of the radiation and only reflects a minority portion (e.g. about 1%) of the radiation towards the energy sensor 55. As shown in FIG. 8, the energy sensors 55 are optically downstream of the optical fibers 30 of the illumination branches 51-54. This allows the energy sensors 55 to measure the intensity of radiation that is output by the illumination branches 51-54. However, the energy sensors 55 could be positioned upstream of the optical fibers 30 (although the measurements made by the energy sensors would not then take into account the losses in the optical fibers 30).

It is not essential for the metrology apparatus MT to comprise the energy sensors 55. For example, a radiation dose sensor could be used to measure the radiation that is received at the target TT.

As shown in FIG. 8, in an embodiment the metrology apparatus MT comprises at least two polarizers 56. In particular, in an embodiment each illumination branch 51-54 comprises a polarizer 56. The polarizers 56 are configured to polarize the radiation transmitted through the corresponding illumination branches 51-54. As shown in FIG. 8, in an embodiment the polarizers 56 are optically downstream of the optical fibers 30 of the illumination branches 51-54. In an embodiment, the polarizers 56 are configured to polarize the illumination radiation in the appropriate mode just before the radiation hits the target TT.

In an embodiment, the polarizers 56 are controllable to allow transmission of a selectable polarisation. For example, the mode of the polarizer can be switched to provide the appropriate polarisation of radiation. In an alternative embodiment, the polarizers 56 are not controllable in this way and provide a fixed polarisation of radiation.

As shown in FIG. 8, in an embodiment the metrology apparatus MT comprises a detection branch. The detection branch is configured to collect radiation diffracted and/or scattered from the structure TT on the substrate W. As shown in FIG. 6, in an embodiment the detection branch comprises a detection lens 16 and further optics 24. In an embodiment the detection branch comprises the sensor 19. In an embodiment the detection branch comprises a beam splitter.

In an embodiment, the detection branch comprises a processor configured to process data obtained by the sensor 19. In an embodiment, the processor is configured to implement computational imaging algorithms for correcting aberrations in the diffracted radiation. In an embodiment, the optics 24 of the detection branch are simplified compared to the comparative example shown in FIG. 5. As a result of the simplified optics, there may be an increase in aberrations in the diffracted radiation. The computational imaging algorithms are used to correct these aberrations that are due to the simplified optics.

In an embodiment, the detection branch is configured to collect non-zeroth diffraction order radiation. For example, in an embodiment the detection branch 16, 24 is configured to collect the +1 and −1 orders of diffraction. In an embodiment, the detection branch 16, 24 is not configured to collect specularly reflected radiation.

In an embodiment, the illumination branches 51-54 are separate from the detection branch 16, 24. The illumination branches 51-54 do not share any components in common with the detection branch 16, 24.

As shown in FIG. 8, in an embodiment the metrology apparatus MT comprises at least one image sensor 19. The image sensor 19 is configured to detect the radiation diffracted from the structure TT on the substrate W. As shown in FIG. 8, in an embodiment the metrology apparatus MT comprises a plurality of (e.g. two) image sensors 19. The image sensors 19 may be for detecting radiation of different sections of the full spectrum. For example, one image sensor may be for detecting visible radiation and another image sensor 19 may be for detecting infrared radiation. As shown in FIG. 8, in an embodiment a beam splitter 61 is provided for splitting the collected radiation between different image sensors 19. However, it is not essential for there to be a plurality of image sensors. In an alternative embodiment only one image sensor 19 is provided.

As explained above, various components of the metrology apparatus MT are controllable. For example, the radiation source 32, the wavelength selector 33, the radiation switch 27 and the polarizers 56 may be controlled between different modes. In an embodiment, the metrology apparatus MT comprises a controller 58 configured to control one or more of these components.

As explained above, in an embodiment the metrology apparatus MT comprises one or more components for measuring aspects of the radiation. For example, the spectrometer 28 and the energy sensors 55 can measure the wavelength profile and intensity of the illumination radiation that is being used for the measurements. In an embodiment, the controller 58 receives information from these measuring components (e.g. the spectrometer 28 and the energy sensors 55). In an embodiment, the controller 58 generates control signals based on the received information. This allows for feedback control of the illumination radiation used for the measurements.

FIG. 9 is a plan view of the optical fibers 30 of four separate illumination branches 51-54 illuminating a target TT on a substrate W according to an embodiment of the invention. The view in FIG. 9 is taken when viewing along the normal to the target TT. The normal may be parallel to the optical axis O of the detection branch 16, 24 (as shown in FIG. 6).

As shown in FIG. 9, the optical fibers 30 of the illumination branches 51-54 are configured to illuminate the target TT from different angles when viewed along the normal to the target TT. In the example shown in FIG. 9, the illumination branches 51 and 52 are for measuring the first set of gratings (with lines in the X direction) of the target TT. The illumination branches 53 and 54 are for measuring the second grating (with lines in the Y direction). The illumination branches 51 and 52 illuminate the target TT from complementary angles. This means that the angle β between the illumination branches 51 and 52 is 180°. Similarly, the illumination branches 53 and 54 illuminate the target TT from complementary angles (i.e. opposite to each other).

In an embodiment, the illumination branches 51-54 are configured to illuminate the target TT from different angles that are evenly spaced from each other. For example, as shown in FIG. 9 the angle α between adjacent illumination branches (e.g. illumination branches 51 and 54) is 90°. This means that all four of the illumination branches 51-54 are at angles that are evenly spaced from each other. There is a 90° angle between each pair of adjacent illumination branches. The illumination branches 51 and 52 are arranged to illuminate the target TT from opposite directions when viewed along the normal to the target TT. The illumination branches 53 and 54 are arranged to illuminate the target TT from opposite directions when viewed along the normal to the target TT.

In an embodiment, the metrology apparatus MT is a diffraction based scatterometer.

Further embodiments are disclosed in the subsequent numbered clauses:

1. A metrology apparatus for determining a characteristic of interest of a structure on a substrate, the apparatus comprising:
   a radiation source for generating illumination radiation;
   at least two illumination branches for illuminating the structure on the substrate, the illumination branches being configured to illuminate the structure from different angles; and
   a radiation switch configured to receive the illumination radiation and transfer at least part of the radiation to a selectable one of the at least two illumination branches.

2. The metrology apparatus of clause 1, wherein the radiation switch comprises a spatial light modulator.

3. The metrology apparatus of clause 2, wherein the spatial light modulator comprises a micromirror device.

4. The metrology apparatus of clause 1, wherein the radiation switch comprises an acousto-optic deflector.

5. The metrology apparatus of claim 4, wherein the radiation switch comprises a lens array configured to couple the radiation beams from the acousto-optic deflector to optical fibers corresponding to the illumination branches.

6. The metrology apparatus of claim 4, wherein the acousto-optic deflector is configured to vary a direction of a radiation beam so as to control how much of the radiation beam couples to an optical fiber of a corresponding illumination branch.

7. The metrology apparatus of claim 4, wherein the radiation switch comprises a Pockels cell configured to control a polarization direction of a radiation beam.

8. The metrology apparatus of claim 7, comprising a polarizing beam splitter configured to transmit or reflect a radiation beam depending on the polarization direction controlled by the Pockels cell.

9. The metrology apparatus of clause 1, wherein the radiation switch comprises at least one beam splitter and a plurality of shutters configured to control transfer of the at least part of the radiation to a selectable one of the at least two illumination branches.

10. The metrology apparatus of any preceding clause, wherein the illumination branches are configured to illuminate the structure from different angles when viewed along a normal to the structure.

11. The metrology apparatus of any preceding clause, wherein the illumination branches are configured to illuminate the structure from different angles that are evenly spaced from each other.

12. The metrology apparatus of any preceding clause, wherein the illumination branches comprise at least one optical fiber for illuminating the structure.

13. The metrology apparatus of clause 12, wherein the at least one optical fiber is for illuminating the structure directly.

14. The metrology apparatus of clause 12, wherein the at least one optical fiber is for illuminating the structure indirectly via at least one other optical element.

15. The metrology apparatus of any preceding clause, comprising:
   a wavelength selector configured to receive the illumination radiation and transmit the illumination radiation of a selected wavelength range, filtering out the illumination radiation outside of the selected wavelength range.

16. The metrology apparatus of claim 15, wherein the wavelength selector comprises an acousto-optic tunable filter configured to transmit the illumination radiation of the selected wavelength range based on a frequency and/or power of acoustic waves excited in the acousto-optic tunable filter.

17. The metrology apparatus of claim 16, comprising at least two acousto-optic tunable filters, at least one arranged upstream of the radiation switch and at least one arranged downstream of the radiation switch.

18. The metrology apparatus of any preceding clause, comprising:
   a spectrometer;
   wherein the radiation switch is configured to selectably transfer at least part of the radiation to the spectrometer.

19. The metrology apparatus of any preceding clause, comprising:
   a beam dump;
   wherein the radiation switch is configured to selectably transfer at least part of the radiation to the beam dump.

20. The metrology apparatus of any preceding clause, comprising at least four illumination branches.

21. The metrology apparatus of any preceding clause, wherein the structure comprises a first grating of lines in a first direction and a second grating of lines in a second direction orthogonal to the first direction,
   wherein at least two of the illumination branches are for determining a characteristic of interest of the first grating from different angles and at least two of the illumination branches are for determining a characteristic of interest of the second grating from different angles.

22. The metrology apparatus of clause 21, wherein at least two of the illumination branches that are for determining a characteristic of interest of the first grating are arranged to illuminate the structure from opposite directions when viewed along a normal to the structure.

23. The metrology apparatus of clause 21 or 22, wherein at least two of the illumination branches that are for determining a characteristic of interest of the second grating are arranged to illuminate the structure from opposite directions when viewed along a normal to the structure.

24. The metrology apparatus of any preceding clause, comprising at least two energy sensors corresponding to the at least two illumination branches, the energy sensors configured to measure an intensity of the radiation transmitted through the corresponding illumination branches.

25. The metrology apparatus of any preceding clause, comprising at least two polarizers corresponding to the at least two illumination branches, the polarizers configured to polarize the radiation transmitted through the corresponding illumination branches.

26. The metrology apparatus of clause 25, wherein the polarizers are controllable to allow transmission of a selectable polarization.

27. The metrology apparatus of any preceding clause, comprising a detection branch configured to collect radiation diffracted and/or scattered from the structure on the substrate.

28. The metrology apparatus of clause 27, wherein the detection branch is configured to collect non-zeroth diffraction order radiation.

29. The metrology apparatus of clause 27 or 28, wherein the at least two illumination branches are separate from the detection branch.

30. The metrology apparatus of any preceding clause, comprising at least one image sensor configured to detect the radiation diffracted from the structure on the substrate.

31. The metrology apparatus of any preceding clause, comprising a controller configured to control the radiation switch and/or the radiation source.

32. The metrology apparatus of clause 31, wherein when the metrology apparatus comprises a wavelength selector, the controller is configured to control the wavelength selector.

33. The metrology apparatus of clause 31 or 32, wherein when the metrology apparatus comprises polarizers, the controller is configured to control the polarizers.

34. The metrology apparatus of any of clauses 31 to 33, wherein when the metrology apparatus comprises energy sensors, the controller is configured to receive information from the energy sensors, wherein the controller generates control signals based on the received information.

35. The metrology apparatus of any of clauses 31 to 34, wherein when the metrology apparatus comprises a spectrometer, the controller is configured to receive information from the spectrometer, wherein the controller generates control signals based on the received information.

36. A method for determining a parameter of interest of a structure on a substrate, the method comprising:
   generating illumination radiation;
   receive the illumination radiation at a radiation switch and transferring at least part of the radiation to a selectable one of the at least two illumination branches;
   sequentially illuminating the structure by the least two illumination branches from different angles;
   collecting at least a portion of radiation diffracted from the structure; and
   receiving and obtaining a recording of the collected diffracted radiation at an image sensor.

37. The method of clause 36, comprising:
   changing a wavelength of the illumination radiation that is received at the radiation switch; and
   again sequentially illuminating the structure by the least two illumination branches from different angles with the illumination radiation of the changed wavelength.

38. A lithographic cell comprising the metrology apparatus according to one of the clauses 1 to 35.

Further embodiments are disclosed in the subsequent list of clauses:

a.) A metrology apparatus for determining a characteristic of interest of a structure on a substrate, the apparatus comprising:
   a radiation source for generating illumination radiation;
   at least two illumination branches for illuminating the structure on the substrate, the illumination branches being configured to illuminate the structure from different angles; and
   a radiation switch configured to receive the illumination radiation and transfer at least part of the radiation to a selectable one of the at least two illumination branches,
      wherein the radiation switch comprises:

a Pockels cell configured to control a polarization direction of the illumination radiation and to output polarization controlled illumination radiation, and a polarizing beam splitter optically downstream of the Pockels cell and configured to, depending on the polarization direction of the polarization controlled illumination radiation, transmit the polarization controlled illumination radiation to a first one of the at least two illumination branches or reflect the polarization controlled illumination radiation to a second one of the illumination branches.

b.) The metrology apparatus according to clause a, further comprising an upstream acousto optic tunable filter, arranged optically upstream of the Pockels cell, and configured to linearly polarize the illumination radiation.

c.) The metrology apparatus according to clause a or b, further comprising a half wavelength retarder arranged in one of the first and second illumination branches and configured to rotate the polarization direction of the polarization controlled illumination radiation respectively transmitted or reflected by the polarizing beam splitter in the one of the first and second illumination branches.

d.) The metrology apparatus according to any of the preceding clauses, wherein the illumination branches each comprise a respective downstream acousto optic tunable filter arranged downstream of the radiation switch and configured to switch on and off the respective illumination branch.

e.) The metrology apparatus according to any of the preceding clauses, further comprising a controller configured to receive data representative of a wavelength of the illumination radiation and to control a voltage applied to the Pockels cell 70 in accordance with the wavelength of the illumination radiation.

f.) The metrology apparatus of any preceding clause, wherein the radiation switch comprises a spatial light modulator and wherein, optionally, the spatial light modulator comprises a micromirror device.

g.) The metrology apparatus of any preceding clause, wherein the radiation switch comprises an acousto-optic deflector.

h.) The metrology apparatus of any preceding clause, wherein the radiation switch comprises at least one beam splitter and a plurality of shutters configured to control transfer of the at least part of the radiation to a selectable one of the at least two illumination branches.

i.) The metrology apparatus of any preceding clause, wherein the illumination branches are configured to illuminate the structure from different angles when viewed along a normal to the structure.

j.) The metrology apparatus of any preceding clause, wherein the illumination branches are configured to illuminate the structure from different angles that are evenly spaced from each other.

k.) The metrology apparatus of any preceding clause, wherein the illumination branches comprise at least one optical fiber for illuminating the structure and wherein, optionally, the at least one optical fiber is for illuminating the structure directly or the at least one optical fiber is for illuminating the structure indirectly via at least one other optical element.

l.) The metrology apparatus of any preceding clause, comprising:

a wavelength selector configured to receive the illumination radiation and transmit the illumination radiation of a selected wavelength range, filtering out the illumination radiation outside of the selected wavelength range.

m.) The metrology apparatus of any preceding clause, comprising at least one of:

a spectrometer and wherein the radiation switch is configured to selectably transfer at least part of the radiation to the spectrometer, and a beam dump and wherein the radiation switch is configured to selectably transfer at least part of the radiation to the beam dump.

n.) The metrology apparatus of any preceding clause, comprising at least two energy sensors corresponding to the at least two illumination branches, the energy sensors configured to measure an intensity of the radiation transmitted through the corresponding illumination branches.

o.) The metrology apparatus of any preceding clause, comprising at least two polarizers corresponding to the at least two illumination branches, the polarizers configured to polarize the radiation transmitted through the corresponding illumination branches and wherein, optionally, the polarizers are controllable to allow transmission of a selectable polarization.

p.) The metrology apparatus of any preceding clause, comprising a detection branch configured to collect radiation diffracted and/or scattered from the structure on the substrate.

q.) The metrology apparatus of clause p.), wherein at least one of:

the detection branch is configured to collect non-zeroth diffraction order radiation, the at least two illumination branches are separate from the detection branch.

r.) A method for determining a parameter of interest of a structure on a substrate, the method comprising:

generating illumination radiation;

receive the illumination radiation at a radiation switch and transferring at least part of the radiation to a selectable one of the at least two illumination branches;

sequentially illuminating the structure by the least two illumination branches from different angles;

collecting at least a portion of radiation diffracted from the structure; and receiving and obtaining a recording of the collected diffracted radiation at an image sensor, wherein the radiation switch comprises:

a Pockels cell configured to control a polarization direction of the illumination radiation and to output polarization controlled illumination radiation, and a polarizing beam splitter optically downstream of the Pockels cell and configured to, depending on the polarization direction of the polarization controlled illumination radiation, transmit the polarization controlled illumination radiation to a first one of the at least two illumination branches or reflect the polarization controlled illumination radiation to a second one of the illumination branches.

s.) A lithographic cell comprising the metrology apparatus according to one of the claims a.) to q.)

Although specific reference is made in this text to "metrology apparatus" or "inspection apparatus", both terms may also refer to an inspection apparatus or an inspection system. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A apparatus, comprising:
   a radiation source configured to generate illumination radiation;
   at least two illumination branches comprising at least one optical fiber and configured to illuminate a structure on a substrate from different angles; and
   a radiation switch configured to receive the illumination radiation and transfer at least part of the radiation to a selectable one of the at least two illumination branches.

2. The apparatus of claim 1, wherein the at least one optical fiber is for illuminating the structure directly.

3. The apparatus of claim 1, wherein the at least one optical fiber is for illuminating the structure indirectly via at least one other optical element.

4. The apparatus of claim 1, wherein the radiation switch comprises a micromirror device configured to apply a spatially varying modulation to the illumination radiation.

5. The apparatus of claim 1, wherein the radiation switch comprises an acousto-optic deflector configured to vary a direction of a radiation beam so as to control how much of the radiation beam couples to one optical fiber of a corresponding illumination branch.

6. The apparatus of claim 5, wherein the radiation switch comprises a lens array configured to couple radiation beams from the acousto-optic deflector to optical fibers corresponding to the illumination branches.

7. The apparatus of claim 1, wherein the radiation switch comprises:
   a Pockels cell configured to control a polarization direction of the illumination radiation and to output polarization controlled illumination radiation, and
   a polarizing beam splitter optically downstream of the Pockels cell and configured to, depending on the polarization direction of the polarization controlled illumination radiation, transmit the polarization controlled illumination radiation to a first one of the at least two illumination branches or reflect the polarization controlled illumination radiation to a second one of the illumination branches.

8. The apparatus of claim 1, wherein the radiation switch comprises at least one beam splitter and a plurality of shutters configured to control transfer of the at least part of the radiation to a selectable one of the at least two illumination branches.

9. The apparatus of claim 1, further comprising a wavelength selector configured to receive the illumination radiation and transmit the illumination radiation of a selected wavelength range, filtering out the illumination radiation outside of the selected wavelength range.

10. The apparatus of claim 9, wherein the wavelength selector comprises an acousto-optic tunable filter configured to transmit the illumination radiation of the selected wavelength range based on a frequency or power of acoustic waves excited in the acousto-optic tunable filter.

11. The apparatus of claim 1, wherein:
    a wavelength selector comprises at least two acousto-optic tunable filters,
    at least one arranged upstream of the radiation switch, and
    at least one arranged downstream of the radiation switch.

12. The apparatus of claim 1, further comprising a spectrometer, wherein the radiation switch is configured to selectably transfer at least part of the radiation to the spectrometer.

13. The apparatus of claim 1, further comprising a beam dump, wherein the radiation switch is configured to selectably transfer at least part of the radiation to the beam dump.

14. The apparatus of claim 1, wherein:
    the structure comprises a first grating of lines in a first direction and a second grating of lines in a second direction orthogonal to the first direction, and
    at least two of the illumination branches are configured to determine a characteristic of interest of the first and the second gratings from different angles.

15. The apparatus of claim 1, wherein the at least two illumination branches are arranged to illuminate the structure from opposite directions when viewed along a normal direction to the structure.

16. The apparatus of claim 1, further comprising at least two energy sensors each corresponding to one of the at least two illumination branches and configured to measure an intensity of the radiation transmitted through the corresponding one illumination branch.

17. The apparatus of claim 1, further comprising at least two controllable polarizers each corresponding to one of the at least two illumination branches and configured to allow transmission of a selectable polarization portion of the radiation transmitted through the corresponding one illumination branch.

18. The apparatus of claim 1, further comprising a detection branch separable from the at least two illumination branches and configured to collect non-zeroth diffraction order radiation diffracted from the structure on the substrate.

19. A method comprising:
    generating illumination radiation;
    receiving the illumination radiation at a radiation switch;

transferring at least part of the illumination radiation from the radiation switch to a selectable one of at least two illumination branches comprising at least one optical fiber;

sequentially illuminating a structure from different angles using the at least two illumination branches;

collecting at least a portion of radiation diffracted from the structure; and receiving and obtaining a recording of the collected diffracted radiation at an image sensor.

20. A lithographic cell, comprising:

an apparatus configured to determine a characteristic of interest of a structure on a substrate, the apparatus comprising:
- a radiation source configured to generate illumination radiation;
- at least two illumination branches comprising at least one optical fiber and configured to illuminate a structure on a substrate from different angles; and
- a radiation switch configured to receive the illumination radiation and transfer at least part of the radiation to a selectable one of the at least two illumination branches.

* * * * *

UNITED STATES PATENT AND TRADEMARK OFFICE
CERTIFICATE OF CORRECTION

| | | |
|---|---|---|
| PATENT NO. | : 11,549,806 B2 | Page 1 of 1 |
| APPLICATION NO. | : 17/141698 | |
| DATED | : January 10, 2023 | |
| INVENTOR(S) | : Van Dam et al. | |

It is certified that error appears in the above-identified patent and that said Letters Patent is hereby corrected as shown below:

On the Title Page

Column 1, Item (73), in "Assignee", Line 1, delete "Netherland" and replace with --Netherlands--.

In the Specification

In Column 13, Line 57, delete "1.5." and replace with --1.5°.--.

In Column 14, Line 1, delete "1" and replace with --1°--.

Signed and Sealed this
Eleventh Day of June, 2024

Katherine Kelly Vidal
*Director of the United States Patent and Trademark Office*